(12) United States Patent
Tan et al.

(10) Patent No.: US 10,128,221 B2
(45) Date of Patent: Nov. 13, 2018

(54) PACKAGE ASSEMBLY HAVING INTERCONNECT FOR STACKED ELECTRONIC DEVICES AND METHOD FOR MANUFACTURING THE SAME

(71) Applicant: Silergy Semiconductor Technology (Hangzhou) Ltd., Hangzhou (CN)

(72) Inventors: Xiaochun Tan, Hangzhou (CN); Jiaming Ye, Hangzhou (CN)

(73) Assignee: SILERGY SEMICONDUCTOR TECHNOLOGY (HANGZHOU) LTD., Hangzhou (CN)

( * ) Notice: Subject to any disclaimer, the term of this patent is extended or adjusted under 35 U.S.C. 154(b) by 52 days.

(21) Appl. No.: 14/598,679

(22) Filed: Jan. 16, 2015

(65) Prior Publication Data
US 2015/0214200 A1 Jul. 30, 2015

(30) Foreign Application Priority Data
Jan. 20, 2014 (CN) .......................... 2014 1 0024227

(51) Int. Cl.
*H01L 23/48* (2006.01)
*H01L 23/52* (2006.01)
(Continued)

(52) U.S. Cl.
CPC ........ *H01L 25/165* (2013.01); *H01L 21/4842* (2013.01); *H01L 23/495* (2013.01);
(Continued)

(58) Field of Classification Search
CPC ............. H01L 25/165; H01L 23/49861; H01L 23/495; H01L 23/49548; H01L 23/49572;
(Continued)

(56) References Cited

U.S. PATENT DOCUMENTS

| 5,939,779 | A | * | 8/1999 | Kim | ...................... | H01L 21/565 |
| | | | | | | 257/673 |
| 2009/0057822 | A1 | * | 3/2009 | Wen | ...................... | H01L 23/495 |
| | | | | | | 257/531 |
| 2015/0187738 | A1 | * | 7/2015 | Tan | ................... | H01L 23/49572 |
| | | | | | | 257/676 |

FOREIGN PATENT DOCUMENTS

| CN | 1691329 A | 11/2005 |
| CN | 101383334 A | 3/2009 |

(Continued)

OTHER PUBLICATIONS

First Office Action, including Search Report, for Chinese Patent Application No. 201410024227.X, dated Dec. 7, 2015, 7 pages.

*Primary Examiner* — Kimberly Rizkallah
*Assistant Examiner* — Dilinh Nguyen
(74) *Attorney, Agent, or Firm* — Westman, Champlin & Koehler, P.A.

(57) ABSTRACT

A package assembly and a method for manufacturing the same are disclosed. The package assembly includes a lead-frame having at least two groups of leads and a plurality of electronic devices arranged in at least two levels. Each group of leads is electrically coupled to a respective level of electronic devices. The package assembly further includes an interconnect for coupling one or more leads of one group of leads to one or more leads of another group of leads. The package assembly results in increased packaging density, less usage of bonding wires in the package assembly, improves reliability, and prevents possible interference.

10 Claims, 5 Drawing Sheets

(51) Int. Cl.
*H01L 23/02* (2006.01)
*H01L 23/34* (2006.01)
*H01L 25/16* (2006.01)
*H01L 25/00* (2006.01)
*H01L 23/495* (2006.01)
*H01L 21/48* (2006.01)
*H01L 23/00* (2006.01)
*H01L 23/498* (2006.01)
*H01L 23/31* (2006.01)

(52) U.S. Cl.
CPC .. *H01L 23/49548* (2013.01); *H01L 23/49572* (2013.01); *H01L 23/49575* (2013.01); *H01L 23/49861* (2013.01); *H01L 24/17* (2013.01); *H01L 24/81* (2013.01); *H01L 25/50* (2013.01); H01L 23/3107 (2013.01); H01L 2224/16 (2013.01); H01L 2224/16145 (2013.01); H01L 2224/16225 (2013.01); H01L 2224/16245 (2013.01); H01L 2224/16265 (2013.01); H01L 2224/81801 (2013.01); H01L 2924/1203 (2013.01); H01L 2924/1205 (2013.01); H01L 2924/1206 (2013.01); H01L 2924/1207 (2013.01); H01L 2924/1304 (2013.01); H01L 2924/13091 (2013.01); H01L 2924/14 (2013.01)

(58) Field of Classification Search
CPC ......... H01L 25/50; H01L 24/81; H01L 24/17; H01L 23/49575; H01L 21/4842; H01L 2224/16225; H01L 23/3107; H01L 2224/16; H01L 2924/13091; H01L 2924/1205; H01L 2224/16245; H01L 2924/14; H01L 2224/16145; H01L 2924/1203; H01L 2924/1304; H01L 2924/1206; H01L 2224/81801; H01L 2924/1207; H01L 2224/16265
USPC ....... 257/678, 686, 777, 723, 666, 673, 690, 257/692
See application file for complete search history.

(56) References Cited

FOREIGN PATENT DOCUMENTS

| | | |
|---|---|---|
| CN | 103400819 A | 11/2013 |
| CN | 103545297 A | 1/2014 |
| CN | 103633058 A | 3/2014 |
| CN | 103700639 A | 4/2014 |
| CN | 203521406 U | 4/2014 |
| CN | 102832189 B | 7/2014 |

* cited by examiner

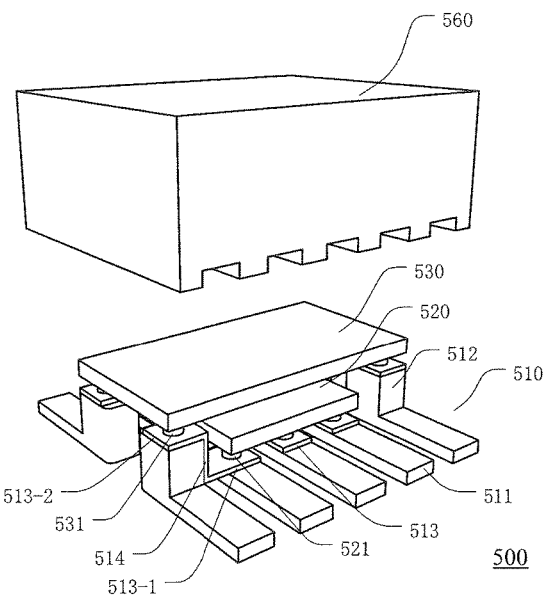
FIG. 5
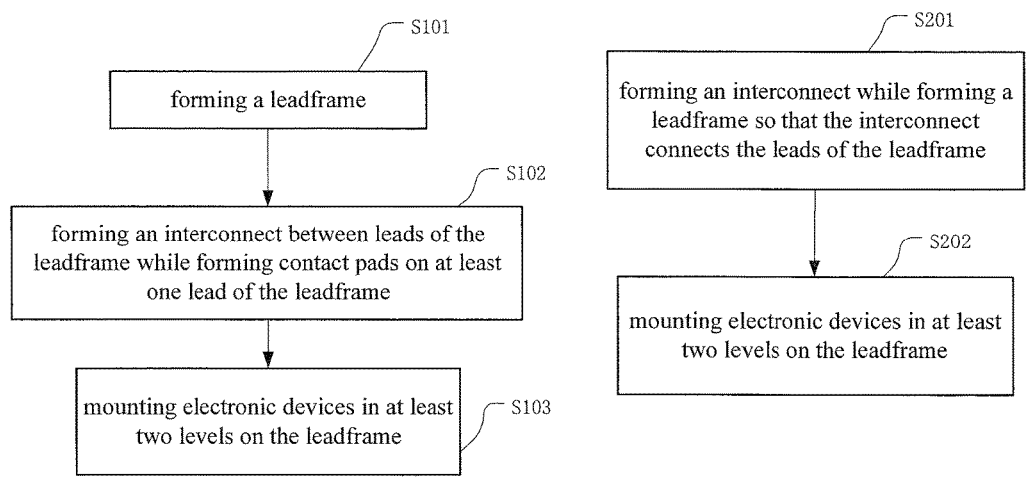
FIG. 6
FIG. 7

PACKAGE ASSEMBLY HAVING INTERCONNECT FOR STACKED ELECTRONIC DEVICES AND METHOD FOR MANUFACTURING THE SAME

CLAIM OF PRIORITY

This application claims priority to Chinese Application No. 201410024227.X, filed on Jan. 20, 2014 (published as CN 103730444A), which is hereby incorporated by reference.

BACKGROUND OF THE INVENTION

Field of the Invention

The present disclosure relates to semiconductor package, and more particularly, to a package assembly and methods for manufacturing the same.

Description of the Related Art

With an increasing demand for miniaturization, light weight and multifunctionality of electronic devices, a semiconductor package is developed towards a high packaging density so that a package size can be reduced. A package assembly using a leadframe and encapsulating a plurality of semiconductor chips has attracted attention. In such package assembly, configuration of the semiconductor chips and their connections have significant effects on the package size and properties of the package assembly.

FIG. 1 is a perspective view showing a conventional multi-chip package assembly 100. In the package assembly 100, two semiconductor chips 120 and 130 are arranged side by side on a leadframe 110. The leadframe 110 includes a plurality of finger-like leads 111. Each lead 111 has a top surface with a contact pad 112. Conductive bumps 121 are provided at a lower surface of the first semiconductor chip 120, and are soldered to respective ones of the contact pads 112 of a first group of leads 111. Conductive bumps 131 are provided at a lower surface of the second semiconductor chip 130, and are soldered to respective ones of the contact pads 112 of a second group of leads 111. The leadframe 110 and the semiconductor chips 120 and 130 are encapsulated by an encapsulant layer 160. At least portions of the leads 111 of the leadframe 110 are exposed from the encapsulant layer 160, for electric connection with external circuits, such as a PCB (i.e. printed circuit board).

Nevertheless, the arrangement of the semiconductor chips 120 and 130 side by side is disadvantageous in terms of the packaging density, because the resultant package assembly 100 occupies an area larger than a sum of footprints of the semiconductor chips 120 and 130.

On the other hand, a stacked package assembly is also proposed, in which a plurality of semiconductor chips are stacked on a leadframe. Semiconductor chips in the lowermost level are secured on a leadframe by soldering. Semiconductor chips in an upper level may be secured by adhesion on top surfaces of semiconductor chips in a lower level. The semiconductor chips in the upper level may be electrically coupled to the leadframe by bonding wires. Although the stacked package assembly can reduce its footprints, the bonding wires are used in the package assembly and result in a complex bonding process and an increased manufacture cost.

In the above stacked package assembly according to the prior art, a large number of bonding wires are used and possibly interference with each other, which deteriorates high-frequency performance of the semiconductor devices in the package assembly, or even failure of the electronic devices in the package assembly due to poor electrical contact of the bonding wires. In a case that the package assembly includes an inductor electrically coupled to other electronic devices in the package assembly through an external conductive path, the external conductive path will introduce noise.

Thus, it is desirable that the packaging density of the package assembly be increased while its reliability and electrical performance be improved.

BRIEF DESCRIPTION OF THE INVENTION

One object of the present disclosure is to provide a package assembly which solves the problems of a large area of the conventional package assembly and adverse effects of the conventional package on properties of the electronic devices.

According to one aspect of the present disclosure, there is provided a package assembly comprising: a leadframe having at least two groups of leads; and a plurality of electronic devices stacked in at least two levels, wherein each group of leads is electrically coupled to a respective level of electronic devices, and the package assembly further comprises an interconnect for coupling one or more leads of one group of leads to one or more leads of another group of leads.

Preferably, the interconnect is formed integrally with at least two leads and electrically couples the at least two leads with each other.

Preferably, the package assembly further comprises a contact pad on at least one lead and being soldered to the electronic devices.

Preferably, the interconnect is formed integrally with the contact pad.

Preferably, the interconnect extends from a top surface of one lead to a side surface of another lead.

Preferably, the interconnect extends from a top surface of one lead to a top surface and a side surface of another lead.

Preferably, all of the leads are coplanar at bottoms in a plane perpendicular to a first direction along which the electronic devices are stacked.

Preferably, at least one electronic device is arranged in each level.

Preferably, the electronic devices comprise at least one selected from a group consisting of a semiconductor chip and a discrete component.

Preferably, the discrete components comprise at least one selected from a group consisting of a resistor, a capacitor, an inductor, a diode and a transistor.

Preferably, the electronic devices comprise an inductor electrically coupled to one lead of a first group of leads and a power device coupled to one lead of a second group of leads, and one terminal of the inductor is electrically coupled to one terminal of the power device through the leads and the interconnect.

Preferably, a first group of leads for an upper level of electronic devices surrounds a second group of leads for a lower level of electronic devices.

Preferably, the first group of leads has an upper surface with a height larger than that of an upper surface of the second group of leads.

According to another aspect of the present disclosure, there is provided a method for manufacturing a package assembly, comprising: forming a leadframe having at least two groups of leads; and mounting at least two levels of electronic devices on the leadframe, wherein each group of leads is electrically coupled to a respective level of electronic devices, wherein before mounting the at least two levels of electronic devices, an interconnect is formed for coupling one or more leads of one group of leads to one or more leads of another group of leads.

Preferably, the interconnect is formed integrally with at least two leads of the leadframe when forming the leadframe.

Preferably, between forming the leadframe and mounting the electronic devices, the method further comprises: forming a contact pad on at least one lead, in which the interconnect is formed integrally with the contact pad.

Preferably, the step of forming the leadframe comprises: forming the leads having different heights by plating for different time periods on selected areas of a substrate.

Preferably, the step of forming the leadframe comprises: forming a metal layer on a substrate; forming a plurality of leads by etching the metal layer; filling trenches between adjacent ones of the plurality of leads with an encapsulant layer; and forming an additional metal layer by plating on top surfaces of a first group of leads of the plurality of leads so that the plurality of leads have top surfaces with different heights.

Preferably, the step of forming the leadframe comprises: forming a metal layer on a substrate; forming upper portions of a first group of leads of the plurality of leads by etching the metal layer; and forming trenches by etching the metal layer to separate adjacent ones of the plurality of leads from each other, so that lower portions of the first group of leads of the plurality of leads are formed together with a second group of leads of the plurality of leads, and the first group of leads has a top surface with a height different from that of the second group of leads.

Preferably, the step of forming the leadframe comprises stamping.

Preferably, the step of mounting the electronic devices comprises: a) providing solder on a first group of leads; b) arranging at least one electronic device in a level; c) repeating steps a) and b) from a lowermost level to a topmost level; d) reflowing so that electronic devices in various levels are secured on respective groups of leads; and e) encapsulating the leadframe and the electronic devices with an encapsulant layer while at least portions of the leads of the leadframe are exposed.

Preferably, the step of mounting the electronic devices comprises: a) providing solder on a first group of leads; b) arranging at least one electronic device in a level; c) reflowing so that the at least one electronic device in one level are secured on a respective group of leads; d) encapsulating the at least one electronic device in one level with an encapsulant layer; e) planarizing an upper surface of the encapsulant layer selectively to expose a second group of leads for electronic devices in an upper level; f) repeating steps a) to e) from a lowermost level to a topmost level; and g) encapsulating the at least one electronic device in an uppermost with an encapsulant layer, wherein at least portions of the leads of the leadframe are exposed from the encapsulant layer in the encapsulating steps.

The package assembly is designed for stacking electronic devices in multiple levels, which results in increased packaging density. The different groups of leads for electronic devices in different levels can be electrically coupled to each other in the package assembly. The package assembly results in less usage of bonding wires in the package assembly, improves reliability, and prevents possible interference of the bonding wires.

The method for manufacturing the package assembly is also improved to reduce adverse effects of a reflow process on properties of the electronic devices, and thus further improve reliability of the package assembly.

BRIEF DESCRIPTION OF THE DRAWINGS

The above and other objects, advantages and features of the present invention will become more fully understood from the detailed description given hereinbelow in connection with the appended drawings, and wherein:

FIG. 5 is a perspective view showing a multi-level package assembly according to a fourth embodiment of the present disclosure;

FIG. 6 is a flow chart of a method for manufacturing a multi-level package assembly according to a fifth embodiment of the present disclosure;

FIG. 7 is a flow chart of a method for manufacturing a multi-level package assembly according to a sixth embodiment of the present disclosure.

DETAILED DESCRIPTION OF EMBODIMENTS OF THE INVENTION

Figure 1:
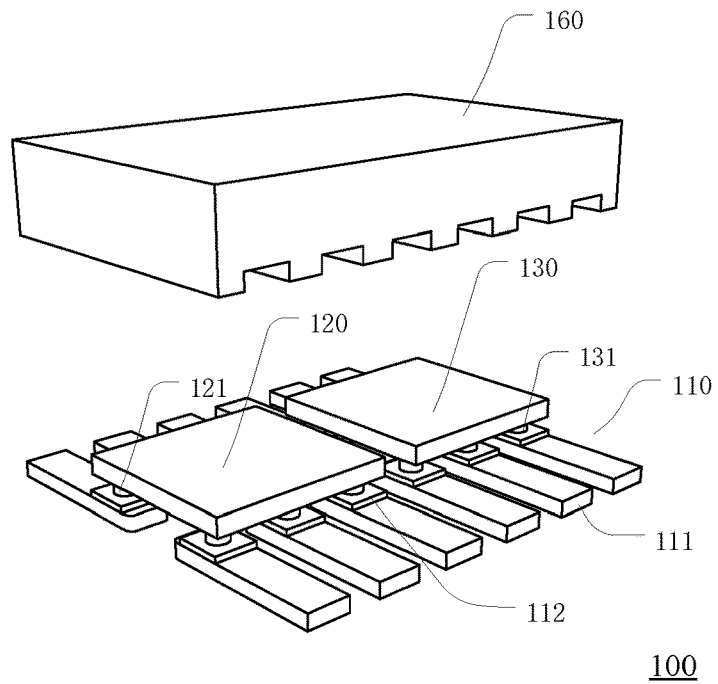
FIG. 1 is a perspective view showing a multi-level package assembly according to the prior art.

Exemplary embodiments of the present disclosure will be described in more details below with reference to the accompanying drawings. In the drawings, like reference numerals denote like members.

The figures are not drawn to scale, for the sake of clarity. For simplicity, the package structure having been subject to several relevant process steps may be shown in one figure. Moreover, some well-known details may be omitted. For example, no solder is shown in all of the figures, a mechanical support and/or an external frame of the leadframe may not be shown in some figures.

It should be understood that when one layer or region is referred to as being "above" or "on" another layer or region in the description of the package structure, it can be directly above or on the other layer or region, or other layers or regions may be intervened therebetween. Moreover, if the device in the figures is turned over, the layer or region will be "under" or "below" the other layer or region. In contrast, when one layer is referred to as being "directly on" or "on and adjacent to" or "adjoin" another layer or region, there are not intervening layers or regions present.

In the present disclosure, the term "electronic device" is not limited to semiconductor chips, but should be understood in a broad sense as any packed objects, including both semiconductor chips and discrete components. The discrete components include at least one selected from a group consisting of a resistor, a capacitor, an inductor, a diode and a transistor.

Some particular details of the present disclosure will be described below, such as exemplary structures, materials, dimensions, process steps and technologies of the package assembly, for better understanding of the present disclosure. However, it can be understood by one skilled person in the art that these details are not always essential for but can be varied in a specific implementation of the disclosure.

Figure 2:
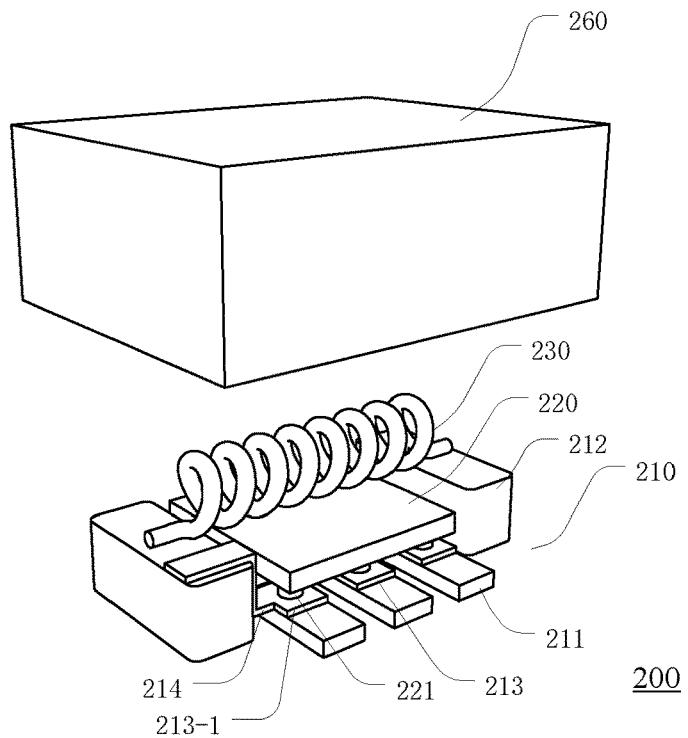
FIG. 2 is a perspective view showing a multi-level package assembly according to a first embodiment of the present disclosure.

FIG. 2 is a perspective view showing a multi-level package assembly 200 according to a first embodiment of the present disclosure. The encapsulant layer 260 is shown as being separated from other parts of the package assembly 200, for the sake of clarity. In the package assembly 200, two levels of electronic devices are mounted on the leadframe 210.

A leadframe 210 includes a first group of leads 211 and a second group of leads 212. Top surfaces of any group of leads of the leadframe 210 may be used directly as interconnect areas, or may have additional contact pads as interconnect areas.

Specifically, a first group of leads 211 each have contact pads 213 with top surfaces as interconnect areas for accommodating solder. A second group of leads 212 each have top surfaces directly as interconnect areas. The first group of leads 211 will be soldered to a first electronic device in a first level, and the second group of leads 212 will be soldered to a second electronic device in a second level. The second level is higher than the first level. Correspondingly, the second group of leads 212 have top surfaces with a height larger than that of top surfaces of the first group of leads 211. The second group of leads 212 surround the first group of leads 211, so that the interconnect areas of the second group of leads 212 surround the interconnect areas of the first group of leads 211. Preferably, the first group of leads 211 and the second group of leads 212 are coplanar at bottoms in a plane perpendicular to a first direction along which the electronic devices are stacked.

Different from the package assembly 100 according to the prior art, at least one lead of the first group of leads 211 is electrically coupled to at least one lead of the second group of leads 212, in the package assembly 200. For example, an interconnect 214 is formed integrally with a contact pad 213-1 of the first group of leads 211. The interconnect 214 extends from a top surface of one lead of the first group of leads 211 to a side surface of one lead of the second group of leads 212. Preferably, the interconnect 214 further extends to a top surface of the one lead of the second group of leads 212, as shown in FIG. 2.

A semiconductor chip 220 and an inductor 230 are stacked one on the other, and mounted on the leadframe 210. The semiconductor chip 220 includes internal circuits and a plurality of conductive bumps 221 which are electrically coupled to the internal circuits. The conductive bumps 221 of the semiconductor chip 220 are soldered to the contact pads of the first group of leads 211 of the leadframe 210. The inductor 230 is arranged above the semiconductor chip 220, and has two terminals which are directly soldered to the second group of leads 212 of the leadframe 210. The semiconductor chip 220, the inductor 230 and the leadframe 210 are encapsulated by an encapsulant layer 260. Bottom surfaces of the first group of leads 211 and the second group of leads 212 are exposed from the encapsulant layer 260, for electric connection with external circuits, such as a PCB (i.e. printed circuit board).

In the package assembly 200, the interconnect 214 electrically couples one or more leads of the first group of leads 211 to one or more leads of the second group of leads 212, for providing electrical connection between the semiconductor chip 220 and the inductor 230.

Alternatively, the above semiconductor chip 220 may be replaced by a power device, such as a power MOSFET. The inductor 230 has two terminals which are directly soldered to the second group of leads 212 of the leadframe 210, for providing electrical connection therebetween. The power device is electrically coupled to the first group of leads 211. One terminal of the inductor 230 is electrically coupled to one terminal of the power device, through one lead of the first group of leads 211, one lead of the second group of leads 212, and the interconnect 214.

Figure 3:
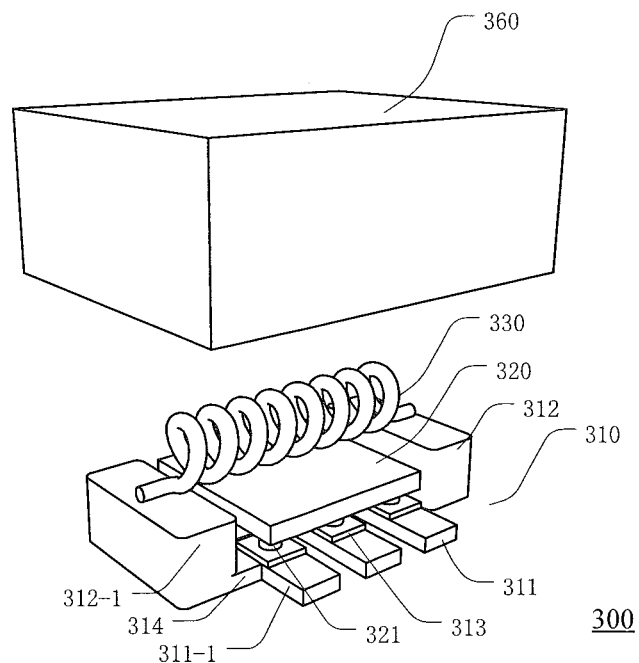
FIG. 3 is a perspective view showing a package assembly according to a second embodiment of the present disclosure.

FIG. 3 is a perspective view showing a multi-level package assembly 300 according to a second embodiment of the present disclosure. The encapsulant layer 360 is shown as being separated from other parts of the package assembly 300, for the sake of clarity. In the package assembly 300, two levels of electronic devices are mounted on the leadframe 310.

A leadframe 310 includes a first group of leads 311 and a second group of leads 312. Top surfaces of any group of leads of the leadframe 310 may be used directly as interconnect areas, or may have additional contact pads as interconnect areas.

A semiconductor chip 320 and an inductor 330 are stacked one on the other, and mounted on the leadframe 310. The conductive bumps 331 of the semiconductor chip 320 are soldered to the contact pads of the first group of leads 311 of the leadframe 310. The inductor 330 is arranged above the semiconductor chip 320, and has two terminals which are directly soldered to the second group of leads 312 of the leadframe 310.

At least one lead of the first group of leads 311 is electrically coupled to at least one lead of the second group of lads 312, in the package assembly 300, so that electronic devices in different levels are electrically coupled to each other. Different from the package assembly 200 according to the first embodiment, one lead 311-1 of the first group of leads 311, one lead 312-1 of the second group of leads 312, and the interconnect 314 therebetween are formed integrally in the package assembly 300, as shown in FIG. 3. The interconnect 314 electrically couples one or more leads of the first group of leads 311 to one or more leads of the second group of leads 312, for providing electrical connection between the semiconductor chip 320 and the inductor 330.

Other aspects of the package assembly 300 according to the second embodiment are the same as those of the package assembly 200 according to the first embodiment.

Figure 4:
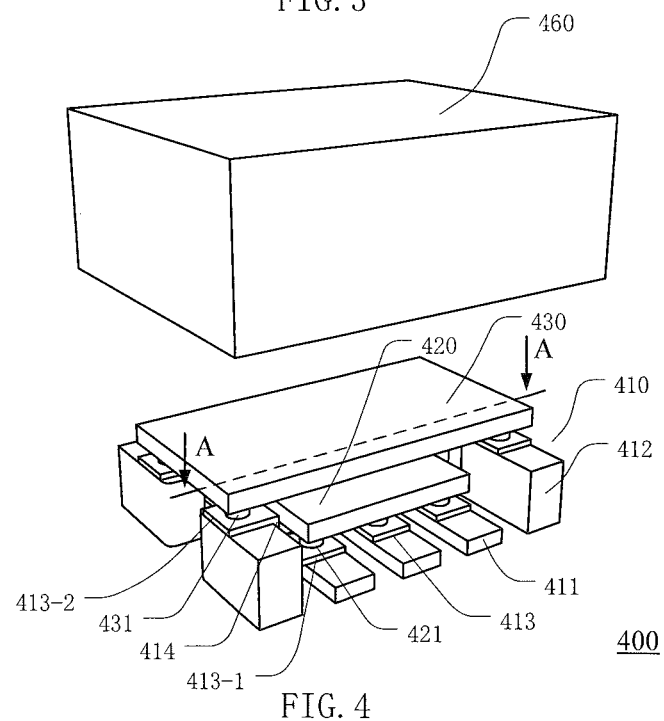
FIG. 4 is a perspective view showing a multi-level package assembly according to a third embodiment of the present disclosure.

FIG. 4 is a perspective view showing a multi-level package assembly 400 according to a third embodiment of the present disclosure. The encapsulant layer 460 is shown as being separated from other parts of the package assembly 400, for the sake of clarity. In the package assembly 400, two levels of electronic devices are mounted on the leadframe 410. A line AA is shown in FIG. 4, crossing a group of contact pads. Cross sectional views in the following FIGS. 8a to 8j are taken along line AA.

A leadframe 410 includes a first group of leads 411 and a second group of leads 412. Top surfaces of any group of leads of the leadframe 410 may be used directly as interconnect areas, or may have additional contact pads as interconnect areas.

A first semiconductor chip 420 and a second semiconductor chip 430 are stacked one on the other, and mounted on the leadframe 410. The first semiconductor chip 420 and the second semiconductor chip 430 each include internal circuits and a plurality of conductive bumps which are electrically coupled to the internal circuits.

The conductive bumps 421 of the first semiconductor chip 420 are soldered to the contact pads 413 of the first group of leads 411 of the leadframe 410. The second semiconductor chip 430 is arranged above the first semiconductor chip 420, and has conductive bumps 431 which are soldered to the contact pads 413 of the second group of leads 412 of the leadframe 410.

At least one lead of the first group of leads 411 is electrically coupled to at least one lead of the second group of leads 412, in the package assembly 400. For example, an interconnect 414 is formed integrally with a contact pad 413-1 of the first group of leads 411, and a contact pad 413-2 of the second leads 412. The interconnect 414 electrically couples one or more leads of the first group of leads 411 to one or more leads of the second group of leads 412, for providing electrical connection between the first semiconductor chip 420 and the second semiconductor chip 430.

Other aspects of the package assembly 400 according to the third embodiment are the same as those of the package assembly 200 according to the first embodiment.

FIG. 5 is a perspective view showing a multi-level package assembly 500 according to a fourth embodiment of the present disclosure. The encapsulant layer 560 is shown as being separated from other parts of the package assembly 500, for the sake of clarity. In the package assembly 500, two levels of electronic devices are mounted on the leadframe 510.

A leadframe 510 includes a first group of leads 511 and a second group of leads 512. Top surfaces of any group of leads of the leadframe 510 may be used directly as interconnect areas, or may have additional contact pads as interconnect areas.

For example, the first group of leads 511 of the leadframe 510 are planar stripes, and the second group of leads 512 are step-like. Further, each lead of the second group of leads 512 has a protrusion portion, and an extension portion extending from the protrusion portion. Ends of the first group of leads 511 and the second group of leads 512 of the leadframe 510 are exposed from the encapsulant layer 560, for electric connection with external circuits, such as a PCB (i.e. printed circuit board).

A first semiconductor chip 520 and a second semiconductor chip 530 are stacked one on the other, and mounted on the leadframe 510. The first semiconductor chip 520 and the second semiconductor chip 530 each include internal circuits and a plurality of conductive bumps which are electrically coupled to the internal circuits.

The conductive bumps 521 of the first semiconductor chip 520 are soldered to the contact pads 513 of the first group of leads 511 of the leadframe 510. The second semiconductor chip 530 is arranged above the first semiconductor chip 520, and has conductive bumps 531 which are soldered to the contact pads 513 of the second group of leads 512 of the leadframe 510.

At least one lead of the first group of leads 511 is electrically coupled to at least one lad of the second group of lads 512; in the package assembly 500. For example, an interconnect 514 is formed integrally with a contact pad 513-1 of the first group of leads 511, and a contact pad 513-2 of the second leads 512. The interconnect 514 electrically couples one or more leads of the first group of leads 511 to one or more leads of the second group of leads 512, for providing electrical connection between the first semiconductor chip 520 and the second semiconductor chip 530.

Other aspects of the package assembly 500 according to the fourth embodiment are the same as those of the package assembly 200 according to the first embodiment.

In the above first to fourth embodiments, the package assemblies including the electronic devices in two levels have been described. Apparently, the package assembly may be designed for mounting the electronic devices in two and more levels. As mentioned above, the leadframe may have two or more groups of leads corresponding to electronic devices in different levels. Interconnect areas of one group of leads for an upper level have a height larger than that of interconnect areas of another group of leads for a lower level, and surround the interconnect areas of another group of leads for the lower level.

The discrete components are arranged above the semiconductor chips in the first to fourth embodiments, which, however, is not essential. Alternatively, the discrete components may be arranged below the semiconductor chips.

It is also mentioned hereinabove that electronic devices in an upper level has a size larger than that of electronic devices in a lower level, which, however, does not mean that both a length and a width of an electronic device in an upper level are larger than those of an electronic device in a lower level. Electronic devices in different levels may be arranged in different orientations in a plane perpendicular to a first direction along which the electronic devices are stacked. A second electronic device be arranged above a first electronic device in a case that either of the length and the width of the second electronic device is larger than either of the length and the width of the first electronic device. Moreover, one or more electronic devices may be arranged in a level.

The package assemblies according to the first to fourth embodiments each include a leadframe having a plurality of groups of leads for providing interconnect areas having different heights for mounting electronic devices in stacked manner. Thus, the package assemblies result in an increased packaging density. Moreover, the interconnect areas of the plurality of groups of leads are soldered directly to the electronic devices in different levels. Consequently, less bonding wires, or even no bonding wires, are used in the package assembly, which avoids potential poor contacts of the bonding wires in the package assembly and improves reliability of the package assembly. The different groups of leads for electronic devices in different levels can be electrically coupled to each other in the package assembly so that interference between adjacent ones of the bonding wires can be avoided.

FIG. 6 is a flow chart of a method for manufacturing a multi-level package assembly according to a fifth embodiment of the present disclosure. In step S101, a leadframe is formed and has a plurality of leads which are divided into two or more groups. In step S102, a contact pad is formed on at least one lead of the plurality of leads. An interconnect is formed integrally with at least one contact pad. The interconnect couples one or more leads of one group of leads to one or more leads of another group of leads. In step S103, a plurality of levels of electronic devices are mounted on the leadframe, wherein each group of leads is electrically coupled to a respective level of electronic devices, In step S101, the leads having different heights may be formed by plating for different time periods on selected areas of a substrate.

FIG. 7 is a flow chart of a method for manufacturing a multi-level package assembly according to a sixth embodiment of the present disclosure. In step S201, a leadframe is formed and has a plurality of leads which are divided into two or more groups. An interconnect is formed integrally with at least two leads of the leadframe when forming the leadframe. The interconnect couples one or more leads of one group of leads to one or more leads of another group of leads. In step S202, a plurality of levels of electronic devices are mounted on the leadframe, wherein each group of leads is electrically coupled to a respective level of electronic devices, In step S201, the leads having different heights may be formed by plating for different time periods on selected areas of a substrate.

FIGS. 8a to 8j are cross sectional views illustrating various steps of a method for manufacturing a package assembly according to an embodiment of the preset disclosure. The method is an example for manufacturing the package assembly 400 according to the third embodiment of the present disclosure.

Figure 8A:
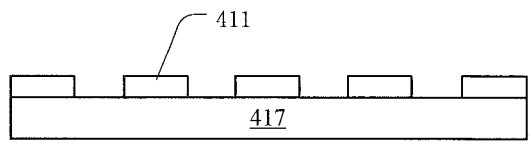
FIGS. 8a to 8j are cross sectional views illustrating various steps of a method for manufacturing a package assembly according to an embodiment of the preset disclosure.
Figure 8B:
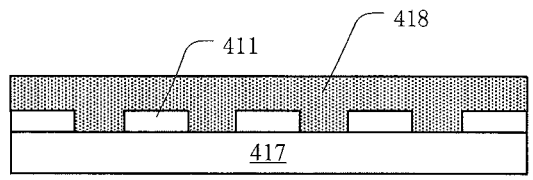
Figure 8C:
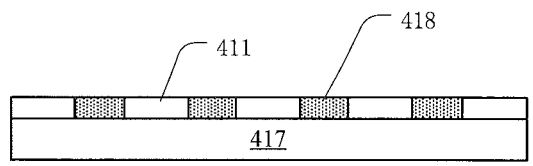
Figure 8D:
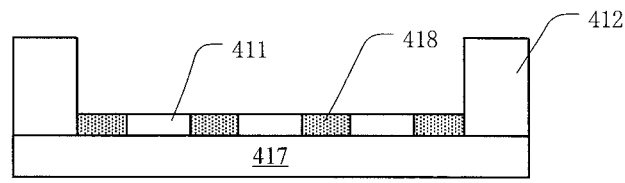
Figure 8E:
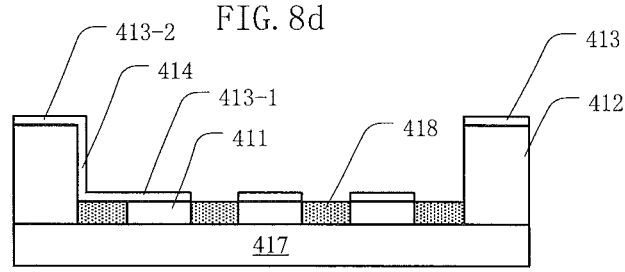
Figure 8F:
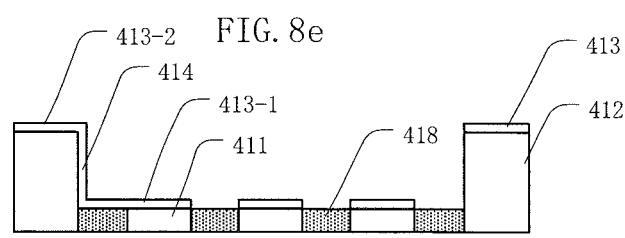

The method is started with a bilayer structure, including a substrate 417 (for example, made of iron-nickel alloy) and a metal layer (for example, made of copper). The substrate 417 provides a mechanical support and will be finally removed as a sacrificial layer. The metal layer is patterned, for example, by etching through a first mask into stripes to form leads 411, as shown in FIG. 8a. An etchant is used in the etching for selectively removing exposed portions of the metal layer with respect to the underneath substrate 417. The first mask is removed after the etching. Next, exposed surfaces of the leads 411 and the substrate 417 are encapsulated by an encapsulant layer 418 (for example, epoxy resin), as shown in FIG. 8b. The encapsulant layer 418 should have a thickness sufficient to completely fill trenches between adjacent ones of the leads 411. The encapsulant layer 418 is then planarized, for example, by grinding, so that top surfaces of the leads 411 are exposed again, as shown in FIG. 8c. The top surfaces of some of the leads are covered with a second mask, while the top surfaces of other ones of the leads are exposed therefrom. The exposed surfaces of the other ones of the leads 411 are then plated, for example, by electroplating or electroless plating, with the same metal as that of the leads to form the leads 412 having top surfaces with a larger height, as shown in FIG. 8d. The second mask is removed after the plating. Next, using a third mask, portions of top surfaces of some of the leads are exposed and plated, for example, by electroplating or electroless plating, with a metal such as silver, to form the contact pads 413, as shown in FIG. 8e. The third mask is removed after the plating. Next, the substrate 417 is selectively removed by using a suitable etchant with respect to the leads 411 and 412, the contact pads 413 and the encapsulant layer 418, to form a leadframe 410 having the first group of leads 411 and the second group of least 412, as shown in FIG. 8f.

In the above etching step, the third mask includes a pattern suitable for defining a contact pad layout, so that an interconnect 414 is formed integrally with a contact pad 413-1 of the first group of leads 411, and a contact pad 413-2 of the second leads 412. The interconnect 414 extends from a top surface of one lead of the first group of leads 411 to a side surface of one lead of the second group of leads 412. Preferably, the interconnect 414 further extends to a top surface of the one lead of the second group of leads 412. The interconnect 414 electrically couples one or more leads of the first group of leads 411 to one or more leads of the second group of leads 412.

Figure 8G:
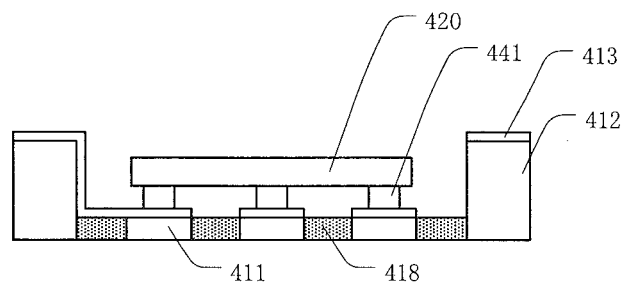
Figure 8H:
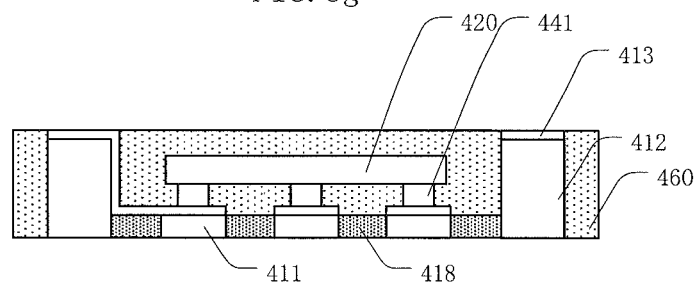
Figure 8I:
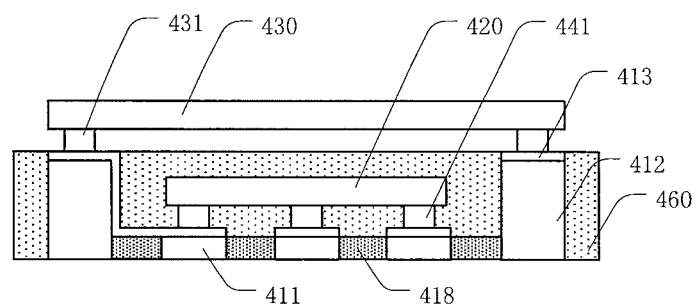
Figure 8J:
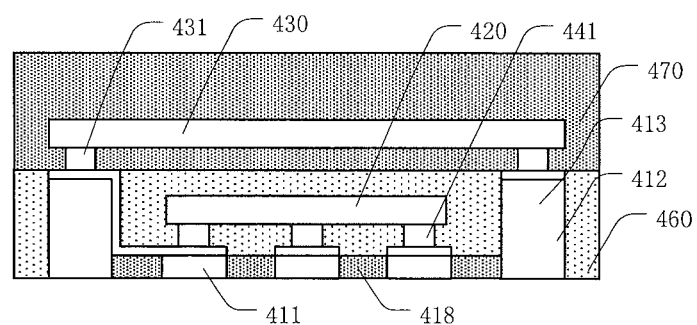

Next, a first semiconductor chip 420 is placed on the leadframe 410, as shown in FIG. 8g. The first semiconductor chip 420 includes internal circuits which are electrically coupled to conductive bumps 441 by conductive vias. A reflow process is performed so that the first semiconductor chip 420 is soldered to the first group of leads 411 of the leadframe 410. The first semiconductor chip 420 is then encapsulated by an encapsulant layer 460 (for example, epoxy resin). The encapsulant layer 460 is then planarized, for example, by grinding, so that top surfaces of the second groups of leads 412 of the leadframe 410 are exposed again, as shown in FIG. 8h. Next, a second semiconductor chip 430 is placed on the leadframe 410. A reflow process is performed again so that the second semiconductor chip 430 is soldered to the second group of leads 412 of the leadframe 410, as shown in FIG. 8i. The leadframe 410, the first semiconductor chip 420 and the second semiconductor chip 430 are then encapsulated by an encapsulant layer 470 (for example, epoxy resin). Preferably, the encapsulant layer 470 is then planarized, for example, by grinding, so that a thickness of a top portion of the encapsulant layer 470 is decreased for improved heat dissipation. The resultant package assembly 400 is shown in FIG. 8j.

In the second reflow process for the second semiconductor chip 430, the encapsulant layer 460 protects soldering of the first semiconductor chip 420 to ensure reliability of the interconnect.

In the above method, the interconnect 414 is formed integrally with the contact pads, and electrically couples one or more leads of the first group of leads 411 to one or more leads of the second group of leads 412, for providing electrical connection between the first semiconductor chip 420 and the second semiconductor chip 430.

Alternatively, another method for forming a leadframe may be started with a metal sheet (for example, a copper sheet). The leadframe 310 in the package assembly 300 according to the second embodiment of the present disclosure is formed by two etching processes and one plating process. For example, the method comprises forming the interconnect 314 between two leads, directly from the metal layer in the first etching process as shown in FIG. 8a. The interconnect 314 is formed integrally with the leads, and electrically couples one or more leads of the first group of leads 311 to one or more leads of the second group of leads 312. Next, the contact pads 313 are formed in the plating process. The substrate is then removed in the second etching process.

Alternatively, another method for forming a leadframe may be started with a metal sheet (for example, a copper sheet). The leadframe 410 in the package assembly 400 according to the third embodiment of the present disclosure is formed by three etching processes and one plating process. In such method, the first etching process is performed by using a first mask, so that shielded portions of the metal sheet are formed as upper portions of the second group of leads, while exposed portions of the metal sheet have a decreased thickness. The second etching process is performed by using a second mask, so that shielded portions of the metal sheet are formed as the first group of leads 411 and the second group of leads 412, while exposed portions of the metal sheet are removed to form trenches for isolating adjacent ones of the first group of leads 411 and the second group of leads 412. Next, the contact pads 413 and the interconnect 414 are formed by plating. The interconnect 414 electrically couples one or more leads of the first group of leads 411 to one or more leads of the second group of leads 412. The substrate is then removed in the third etching process.

Alternatively, another method for forming a leadframe may be started with a metal sheet (for example, a copper sheet). The leadframe 310 in the package assembly 300 according to the second embodiment of the present disclosure is formed by one stamping process and one plating process. In such method, a suitable mold is used, and the first group of leads 311, the second group of leads 312, and the interconnect 314 are formed integrally and directly by stamping. Next, the contact pads 313 are formed in the plating process. The interconnect 314 electrically couples one or more leads of the first group of leads 311 to one or more leads of the second group of leads 312.

Alternatively, a plurality of levels of electronic devices may be reflowed simultaneously when forming the package assembly 400 according to the third embodiment of the present disclosure. In such method, the second semiconductor chip 430 is placed immediately after placing the first semiconductor chip 420 as shown in FIG. 8g. The encapsulating and planarizing processes as shown in FIG. 8h can be omitted. After placing all of the semiconductor chips, one reflow process is performed so that the first semiconductor chip 420 is secured on the first group of leads 411 of the leadframe 410, and the second semiconductor chip 430 is secured on the second group of leads 412 of the leadframe 410 by solder. The leadframe 410, the first semiconductor chip 420 and the second semiconductor chip 430 are then encapsulated by an encapsulant layer 460 (for example, epoxy resin) to form the package assembly 400.

In such alternative, the electronic devices in different levels are simultaneously reflowed in one reflow process, which simplifies the manufacture process and avoids interconnect failure due to a plurality of reflow processes.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

What is claimed is:

1. A package assembly comprising:
a leadframe having at least two groups of leads;
an encapsulant layer for filling trenches between adjacent leads of said at least two groups of leads and exposing top surfaces of said at least two groups of leads, and
a plurality of electronic devices stacked in at least two levels,
wherein each group of leads is electrically coupled to and is used for securing a respective level of electronic devices, and
said package assembly further comprises a contact pad on at least one lead and being soldered to said electronic devices, and an interconnect being formed integrally with said contact pad and extending at least partially on said encapsulant layer for coupling one or more leads of one group of leads to one or more leads of another group of leads.

2. The package assembly according to claim 1, wherein said interconnect extends from a top surface of one lead to a side surface of another lead.

3. The package assembly according to claim 1, wherein said interconnect extends from a top surface of one lead to a side surface and a top surface of another lead.

4. The package assembly according to claim 1, wherein all of said at least two groups of leads are coplanar at bottoms in a plane perpendicular to a first direction along which said electronic devices are stacked.

5. The package assembly according to claim 1, wherein at least one electronic device is arranged in each level.

6. The package assembly according to claim 1, wherein said electronic devices comprise at least one selected from a group consisting of a semiconductor chip and a discrete component.

7. The package assembly according to claim 6, wherein said discrete component comprises at least one selected from a group consisting of a resistor, a capacitor, an inductor, a diode and a transistor.

8. The package assembly according to claim 6, wherein said electronic devices comprise an inductor electrically coupled to one lead of a first group of leads and a power device coupled to one lead of a second group of leads, and one terminal of said inductor is electrically coupled to one terminal of said power device through said at least two groups of leads and said interconnect.

9. The package assembly according to claim 1, wherein a first group of leads for an upper level of a first electronic device surrounds a second group of leads for a lower level of a second electronic device.

10. The package assembly according to claim 9, wherein said first group of leads has an upper surface with a height higher than that of an upper surface of said second group of leads.

* * * * *